(12) United States Patent
Maehara

(10) Patent No.: US 6,866,973 B2
(45) Date of Patent: Mar. 15, 2005

(54) PHOTOSENSITIVE RESIN COMPOSITION, RESIST COMPOSITION, FABRICATING METHOD FOR PATTERNED SUBSTRATE, AND DEVICE

(75) Inventor: Hiroshi Maehara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 286 days.

(21) Appl. No.: 09/998,228

(22) Filed: Dec. 3, 2001

(65) Prior Publication Data

US 2002/0086226 A1 Jul. 4, 2002

(30) Foreign Application Priority Data

Dec. 4, 2000 (JP) ........................................ 2000-368588

(51) Int. Cl.[7] .............................. G03F 7/039; G03F 7/30
(52) U.S. Cl. ...................... 430/18; 430/270.1; 430/326; 430/296; 430/966; 430/967
(58) Field of Search ................................ 430/18, 270.1, 430/326, 296, 966, 967

(56) References Cited

U.S. PATENT DOCUMENTS

| | | | |
|---|---|---|---|
| 5,585,219 A | 12/1996 | Kaimoto et al. | 430/270.1 |
| 5,716,740 A | 2/1998 | Shiba et al. | 430/7 |
| 5,731,123 A * | 3/1998 | Kawamura et al. | 430/176 |
| 5,981,135 A | 11/1999 | Koes et al. | 430/165 |

FOREIGN PATENT DOCUMENTS

| | | |
|---|---|---|
| EP | 0848290 A1 | 6/1998 |
| JP | 5-80515 | 4/1993 |
| JP | 5-265212 | 10/1993 |
| JP | 6-34412 | 2/1994 |
| JP | 10-213903 | 8/1998 |

OTHER PUBLICATIONS

English language machine translation of JP 06–342212.*
Patent Abstracts of Japan, vol. 1995, No. 3 (4/95) for JP6–342,212.
Database WPI, Section Ch, Week 199611, Derwent Publications, AN 1996–101274, XP002194982 (JP8–6252) 1/96.

* cited by examiner

Primary Examiner—Amanda Walke
(74) Attorney, Agent, or Firm—Fitzpatrick, Cella, Harper & Scinto

(57) ABSTRACT

There are provided a photosensitive resin composition containing at least a polymer compound having a sugar structure, which has at least two species of functional groups cleavable in the presence of an acid, and a photo acid generator generating an acid by radiation of an electromagnetic wave or a beam of an electrically charged particle, and in addition, a resist composition, a method for fabricating a patterned substrate for fabricating a semiconductor device and the like, and a device such as a highly integrated semiconductor and the like.

4 Claims, 2 Drawing Sheets

PHOTOSENSITIVE RESIN COMPOSITION, RESIST COMPOSITION, FABRICATING METHOD FOR PATTERNED SUBSTRATE, AND DEVICE

BACKGROUND OF THE INVENTION

1. Field of the Invention

The present invention relates to a resist composition having performances high in sensitivity and high in resolution against an electromagnetic waves such as an ultraviolet light, a far ultraviolet light, a vacuum ultraviolet light, an X-ray, and the like and a electrically charged particle such as an electron beam, an ion beam, and the like, and high in safety against environment, a fabricating method for patterned substrate by using the resist composition, and also the device having a substrate fabricated by the fabricating method.

2. Related Background Art

In recent years, according to a high density and high speed semiconductor integrated circuit, miniaturization and integration of the integrated circuits are being progressed than the past. Large capacity memory devices for these integrated circuits is transcribed from a mask to a semiconductor substrate by using the light belonging to near ultraviolet light and far ultraviolet light. In these ranges of light wavelength, a processible line width of a semiconductor device is coming close to a limit. Therefore, it is necessary to promote to use a short wavelength for an exposing light. In recent years, an ArF excimer laser and a F2 laser are being used as the light source for exposure in order to develop a lithography technology.

In accordance to using such short wavelength as the exposure wavelength, a severe problem arises, for example, a transmittance of the resist against the exposure light lowers to cause deterioration of resolution performance of a pattern. Particularly in light lithography using the ArF excimer laser as the light source, novolac resin and polyvinyl phenol, which is used in a conventional resist and has an aromatic ring in a structure thereof, are very difficult to be used in view of light transmittance due to a high light absorbance by this aromatic ring. On the other hand, it has been known that light transmittance of the exposure light can be improved largely by using an aliphatic polymer. However, as a rule, the resist using the aliphatic polymer is inferior in resistance against dry etching at processing of the substrate following pattern formation. Hence, the resist, which is prepared by using a polymer having an alicyclic group in a polymer side chain, has been developed. For example, the resist prepared by using norbonen-methacrylate copolymer and adamanthyl methacrylate. Resists prepared by these polymers have been described on, for example, Japanese Patent Application Laid-Open No. 5-80515 and Japanese Patent Application Laid-Open No. 5-265212. However, the polymer having the alicyclic group is generally difficult to be fabricated at low cost and low in solubility in a solvent and a developer to cause to be difficult to yield the resist having a high performance. In addition, concerning a material itself for the resist, making a low load on nature environment is required.

On the other hand, the material based on cellulose shows high transmittance in the short wavelength region of the ArF excimer laser and the like and thus, is preferable as the resist. For example, in Japanese Patent Application Laid-Open No. 6-34412, a polymer compound, which is prepared by substituting at least part of a hydroxyl group of cellulose to a protecting group, is proposed to use as the resist. In addition, in Japanese Patent Application Laid-Open No. 10-213903, a proposal is made for a positive type resist compound made of the cellulose resin having an acid functional group, an acidic acrylic resin, and a photo acid generator. However, the polymer prepared by simple substitution of the hydroxyl group of cellulose is difficult to satisfy control of solubility in a solvent, which is used for solubilization of the resist, and solubility of the polymer dissolved in an alkali aqueous solution, which is used for development, and resist performance, at the same time. Therefore, a high performance resist is difficult to be obtained.

SUMMARY OF THE INVENTION

An object of the present invention is to provide a resist composition having performances high in sensitivity and high in resolution against electromagnetic waves such as ultraviolet light, far ultraviolet light, vacuum ultraviolet light, X-ray, and the like and an electrically charged particle such as electron beam, ion beam, and the like, and high in safety against environment, a fabricating method for a patterned substrate by using the resist composition, and also a device having a substrate fabricated by the fabricating method.

According to an aspect of the present invention, there is provided a photosensitive resin composition comprising a polymer compound having a sugar structure, which has at least two species of functional group cleavable in the presence of an acid, and a photo acid generator generating the acid by radiation of an electromagnetic wave or a charged particle beam.

According to another aspect of the present invention, there is provided a photosensitive resin composition containing a polymer compound having a sugar structure, which has at least two species of functional group cleavable in the presence of an acid, and a photo acid generator generating the acid by radiation of an electromagnetic wave or a charged particle beam; and a solvent for dissolving the photosensitive resin composition.

According to still another aspect of the present invention, there is provided a method for fabricating a patterned substrate, which comprises the steps of applying a resist composition to a substrate, exposing the substrate to which the resist composition has been applied, and developing the exposed substrate, wherein the resist composition contains a photosensitive resin composition containing a polymer compound having a sugar structure, which has at least two species of functional group cleavable in the presence of an acid, and a photo acid generator generating the acid by radiation of an electromagnetic wave or a charged particle beam; and a solvent for dissolving the photosensitive resin composition.

According to a further aspect of the present invention, there is provided a device comprising a patterned substrate and an input/output part of a signal, wherein the substrate is fabricated by a fabricating method comprising the steps of applying a resist composition to a substrate, exposing the substrate to which the resist composition has been applied, and developing the exposed substrate, wherein the resist composition contains a photosensitive resin composition containing a polymer compound having a sugar structure, which has at least two species of functional group cleavable in the presence of an acid, and a photo acid generator generating the acid by radiation of an electromagnetic wave or a charged particle beam; and a solvent for dissolving the photosensitive resin composition.

DETAILED DESCRIPTION OF THE PREFERRED EMBODIMENTS

Figure 1:
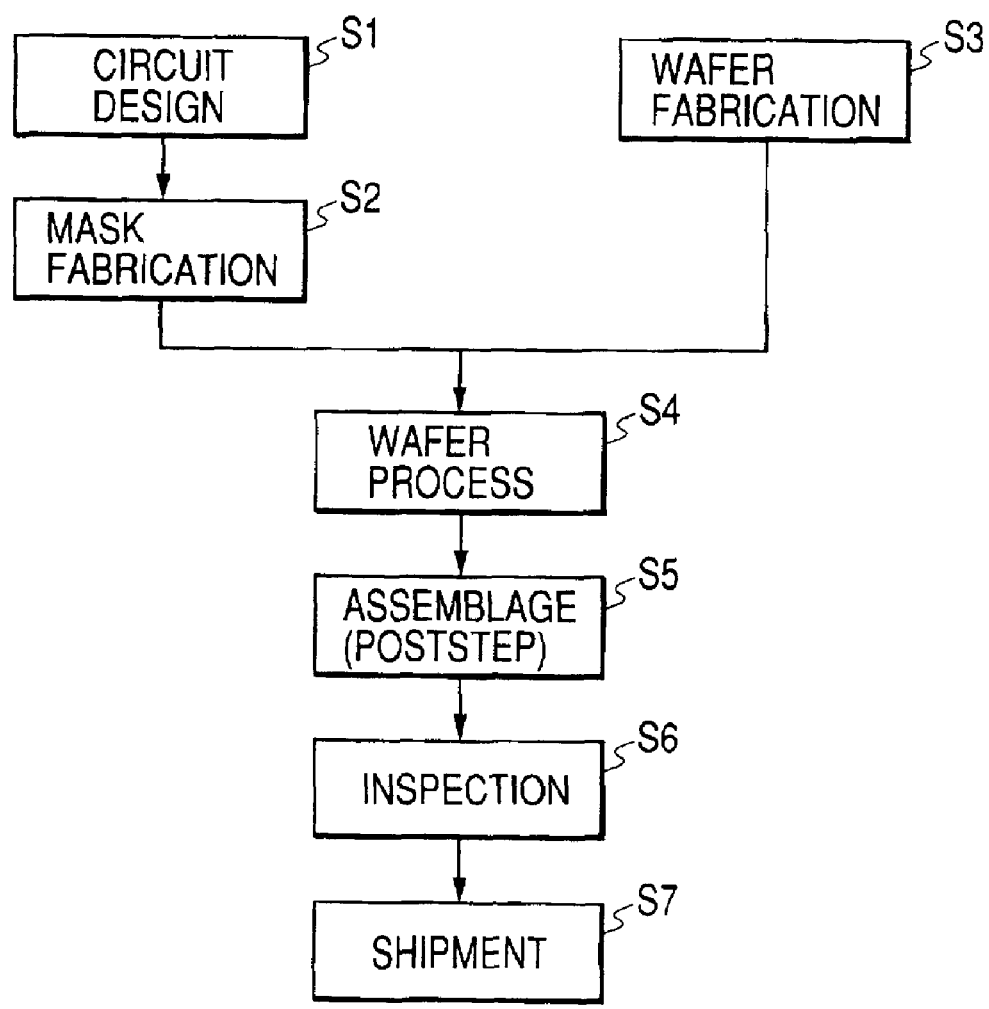
FIG. 1 is a flow chart illustrating the fabricating method for the semiconductor device according to the present invention.

In order to improve the dry etching resistant performance, the present inventors paid their attention to cellulose, which has an alicyclic structure in a main chain, as the polymer having an alicyclic group. Cellulose has the alicyclic structure in the main chain and therefore, a carbon density per a unit volume is high to allow high dry etching resistance. Meanwhile, it has been know that cellulose dissolves in a strong alkali solution and on the other hand, shows a low solubility in common organic solvent. By this reason, the inventors improved solubility by introducing a hydroxyalkyl group in the side chain. In addition, a residue of the functional group cleavable in the presence of acid is added to the hydroxyl group of the hydroxyalkyl cellulose to lower solubility a base resin in an alkali developer with a purpose of improvement of contrast of exposed part and unexposed part. Consequently, the photosensitive resin composition according to the present invention dissolves easily in the solvent and the like and also, is easy to express resist performance, and further, is excellent in applicability to such substrate as semiconductor wafer.

Moreover, hydroxyalkyl group itself contained in the base resin of the photosensitive resin composition has a property as a residue of a functional group weakly cleavable by an action of an acid in the presence of the acid. Thus, it is advantageous to present solubility to the solvent and take a role for improving sensitivity of the resist. On the other hand, the other functional group, which is formed by adding another residue to such a hydroxyalkyl group and is cleavable in the presence of the acid, takes a chief role of expression of resist performance. The presence of such a multiple functional group realizes a high performance resist.

In the photosensitive resin composition according to the present invention, the polymer compound has the sugar structure, which has at least two species of functional group cleavable in presence of acid. When a residue of the functional group cleavable by acid is added to the polymer compound, solubility of the polymer compound against an organic solvent is improved, solubility of the polymer compound is lowered against the alkali developer (working as a dissolution inhibitor), and cleavages of the functional groups increase developing rate to the alkali developer. As the residue of such a functional group, hydroxyalkyl group, tertiary butoxycarbonyl group and the like are preferable, but those presenting the same effect and inhibit no characteristics of the photosensitive resin composition can be used.

In the present invention, by using two species or more of the above described functional groups, the above described effects are satisfactorily expressed to yield an excellent photosensitive resin composition.

The above described acid can be obtained by exposing the photo acid generator to generate the acid by radiation (named exposure) of the electromagnetic wave or the beam of the electrically charged particle.

The sugar structure is exemplified by a monosaccharide such as D-glucose, D-mannose, D-allose, D-altrose, D-galactose, D-talose, D-idose, D-gulose, D-fucose, D-fructose, D-sorbose, L-sorbose, D-tagasose, D-psicose, D-ribose, D-deoxyribose, D-arabinose, D-xylose, D-lyxose, D-ribulose, D-xylulose, D-arabinulose, D-lyxulose, D-threose, D-erythrose, D-erythrulose, D-glyceraldehyde, dihydroxyacetone, and a disaccharide such as sucrose, saccharose, maltose, lactose, cellubiose, trehalose and the like. In addition, the polymer compounds having these sugar structure are exemplified by amylose, cellulose, chitin, chitosan, hyaluronic acid, chondroitin 6-sulfate, keratan sulfate, heparin, and the like.

Further, a molecular weight of these polymer compounds ranges preferably from 20,000 to 2,000,000 and more preferably, 50,000 to 500,000.

As such a polymer compounds as described above, hydroxyalkyl cellulose derivative, in which at least one of hydroxyl groups of hydroxyalkyl cellulose is substituted by a substitutional group capable of generating a hydroxyl group by cleaing by acid, is suitable. Hydroxyalkyl cellulose also has a hydroxyalkyl group which is a residue of the functional group cleavable by acid as described above. Accordingly, the hydroxyalkyl cellulose derivative has two species of the functional groups in total as described above through having the substitutional group capable of generating a hydroxyalkyl group by cleaving by acid besides the functional group cleavable in the presence of acid.

As such a hydroxyalkyl cellulose, hydroxyethyl cellulose and hydroxypropyl cellulose are preferable.

Moreover, t-butoxycarbonyloxy group is preferably used as the substitutional group which substitutes for a hydroxyl group of the hydroxyalkyl cellulose and is cleaved in the presence of acid. Pivaloyloxy group is also used as the substitutional group. When such a pivaloyloxy group is cleaved, the pivaloyloxy group discharges isobutene and carbon dioxide, produces a hydroxyl group in the terminal cleaved, and increases dissolution rate of the polymer compounds against the alkali developer.

As an example, formula (3) shows a hydroxyalkyl cellulose derivative that is the polymer obtained by adding the pivaloyl group to hydroxypropyl cellulose through a reaction of the hydroxypropyl cellulose with pivalic acid.

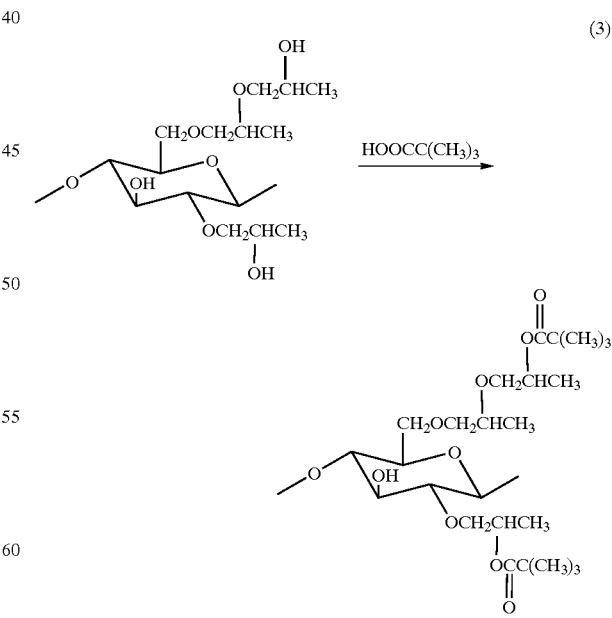

When treated by heat in the presence of water and the acid, this polymer causes a chemical change as shown in formula (4) to be solubilized in an alkali aqueous solution.

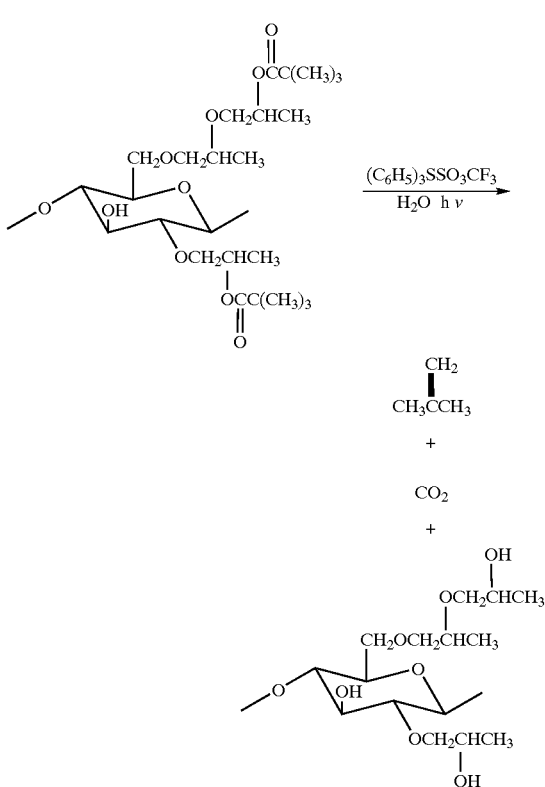

(4)

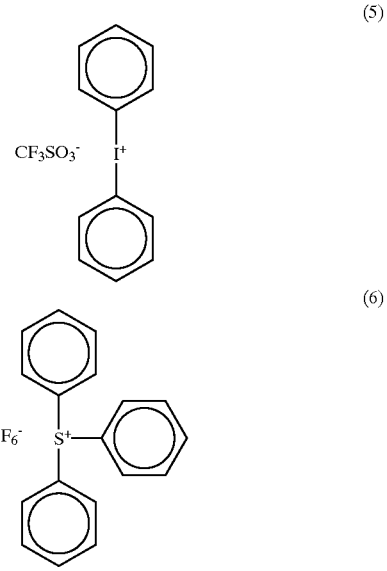

(5)

(6)

In the presence of the acid, not only pivaloyloxy group but also hydroxypyloxy group of the cellulose cleaves to produce the hydroxyl group, which is not shown in the above formula.

In addition, a polymer chain itself of cellulose is occasionally cleaved partially. Meanwhile, as water necessary for the reaction, water contained in an atmosphere or a resist film is used. Humidity of the atmosphere can be adjusted by an apparatus for exclusive use if necessary.

Photosensitive resin composition according to the present invention contains an appropriate photo acid generator to generate the acid by radiation of the electromagnetic wave or the beam of the electrically charged particle.

As a preferable photo acid generator, an iodonium salt such as diphenyliodonium trifluromethyl sulfonate salt shown by formula (5), a sulfonium salt such as triphenyl-sulfonium hexafluoroantimonate shown by formula (6), and the like can be used. The photo acid generator to be added can be used singly or in combination with one or more of the other photo acid generators. Other than these compounds, the photo acid generators are exemplified by diphenyliodonium-paratoluene sulfonate, N-hydroxynaphthalimide-trifluoromethane sulfonate, N-hydroxyphthalimide-trifluoromethane sulfonate, diphenyliodonium-9,10-dimethoxy anthracene-2 sulfonate, bis(4-t-butylphenyl)iodonium-trifluoromethane sulfonate, bis(4-t-butylphenyl)iodonium-p-toluene sulfonate, triphenylsulfonium trifluoromethane sulfonate, tris(4-t-butylphenyl)sulfonium-trifluoromethane sulfonate, triphenylsulfonium trifluoromethane sulfonate, tris(4-t-butylphenyl)sulfonium-hexafluoroantimonate, tris(4-t-butylphenyl)sulfonium-tetrafluoroantimonate, 2-[2'-(5'-methyl 2'-furyl) ethenyl]-4,6-bis(trichloromethyl)-1,3,5-triazine, and the like.

Among the photosensitive resin compositions according to the present invention, it is preferable in viewpoint of film thickness regulation that for 100 mass parts of the polymer compound such as the hydroxyalkyl cellulose derivative and the like, which has the sugar structure having at least two species of the functional groups cleavable in the presence of the acid, the photo acid generator is 0.1 to 20 mass parts and 1 to 10 mass parts is more preferable.

The photosensitive resin compositions according to the present invention can contain, other than the polymer compound such as the hydroxyalkyl cellulose derivative and the like as described above and the photo acid generator as described above, a surfactant, an antioxidant, a pigment compound, and the like. A content thereof ranges preferably from 0.001 to 20 mass parts for 100 mass parts of the photosensitive resin compositions and 0.005 to 10 mass parts is more preferable.

A method for obtaining the photosensitive resin compositions according to the present invention may be mixing each component evenly as possible. The method for mixing is not specially restricted. But when even mixing is difficult for only these components, it is possible that the solvent is added to liquefy and then dried.

When dissolved in the solvent, this photosensitive resin compositions can be used as the resist of so-called chemically amplified type.

In addition to the photosensitive resin compositions as described above, other alkali soluble resin can be used as the resist by dissolving in the solvent. As the alkali soluble resin usable, novolac resin, polyvinyl phenol, and the like used for a conventional resist as shown in Formula (7) and Formula (8) can be used. Further, for lithography using the short wavelength light source such as excimer laser (wavelength 193 nm) and F2 laser (157 nm) of argon fluorinate, it is preferable to use the alkali soluble resin such as polyglutaraldehyde, hydroxypropyl cellulose, hydroxyethyl cellulose, and the like, which have the alicyclic group.

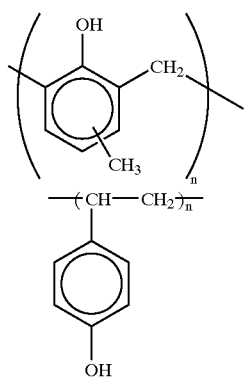

As a mode of using in combination with other alkali soluble resin as described above, combination with the polymer, which is alkali soluble and contains silicon, may be possible. As the polymer, which is alkali soluble and contains silicon, polyparahydroxysesquioxane and siloxane polymer of a ladder type as shown in Formula (9) can be used.

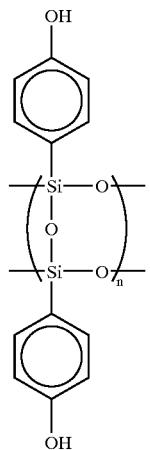

As described above, the resist in combination with the polymer containing silicon can be used as so-called multilayer resist and it is effective against a decrease in a focus depth following a shorter wavelength of the exposure light as use of F2 laser, and an increase in NA (numerical aperture) of an optical system of a light projection exposure apparatus.

As the solvent for preparing these resist compositions, common solvents such as alcoxy ethanols such as methyl cellosolve, ethyl cellosolve and buthyl cellosolve; cellosolve acetate such as methyl cellosolve acetate, ethyl cellosolve acetate and buthyl cellosolve acetate; propylene glycol acetate such as propylene glycol monomethyl acetate; lactic acid esters such as ethyl lactate; aliphatic ketones such as methylethyl ketone, 2-pentanone, methyl isobutyl ketone and methyl isoamyl ketone; alicyclic ketones such as cyclohexanone and N-methyl pyrrolidone; aromatic compounds such as benzene, toluene, xylene and chlorobenzene; and alcohols such as methyl alcohol, ethyl alcohol, n-propyl alcohol, isopropyl alcohol and benzyl alcohol can be used in a single or mixed form. Moreover, with the purpose of controlling solubility to these solvents and vapor pressure, alcohols such as methyl alcohol, ethyl alcohol, n-propyl alcohol and isopropyl alcohol; aliphatic alkane such as pentane, hexane, heptane and octane; and alicyclic compounds such as cyclopentanone and cyclohexane may be blended as the solvent.

Furthermore, with the purpose of adjusting characteristic of application to the substrate, an anionic, cationic or amphoteric surfactant, fluorine-based surfactant and the like may be blended. In addition, in order to improve preservation stability of the resist, a monophenol-based compound such as phenol, cresol, methoxyphenol and 2,6-di-t-buthyl-p-cresol, a bisphenol-based compound such as 2,2'-methylene bis(4-methyl-6-t-butylphenol); a polymer type phenol-based compound such as 1,1,3-tris(2-methyl-4-hydroxy-5-t-butylphenyl)butane; a sulfur-based antioxidant such as dilauryl-3,3'-thiodipropionate; a phosphorus-based antioxidant such as triphenylphosphite; and the antioxidant such as sorbic acid, erythorbic acid, isopropyl citrate and nordihydroguaialetic acid may be added.

Adjusting concentration of the photosensitive resin compositions according to the present invention among the resist composition according to the present invention allows obtaining a desired thickness of the film on the substrate. For the concentration of the photosensitive resin compositions, it is preferable that the polymer compound, which has the sugar structure having at least two species of the functional groups cleavable in the presence of the acid, accounts for preferably 1 to 50 mass % and more preferably about 3 to 30 mass %. Meanwhile, other alkali soluble resin than the photosensitive resin compositions according to the present invention is preferably contained ranging from 0.1 to 40 mass % and more preferably from 1 to 30 mass % in the resist composition. In addition, concentration of the above described surfactant contained in the resist composition ranges preferably from 0.001 to 20 mass % and the preservation stability-improving component as described above ranges preferably from 0.01 to 20 mass % in the resist composition. The resist composition as described above can contain, in addition to compounds as described above, the pigment compound and the like to adjust absorbance of the exposure light and content thereof ranges preferably from 0.01 to 10%. Part other than these components of the resist composition is the solvent.

As described above, the photosensitive resin compositions according to the present invention can be used as the normal resist of so-called chemically amplified type, the resist in combination with other alkali soluble resin, and also the multilayer resist in combination with the polymer containing silicon. Moreover, these combination allows an optimal combination with the exposure wavelength.

The present invention is a pattern forming method comprising the step to apply the resist composition to the substrate such as a silicon wafer, a glass substrate, and the like, the step to expose the substrate, to which the resist composition is applied through a mask or directly, and the step to develop the substrate, which has been exposed, wherein the resist composition is the resist composition as described above. There is no special restriction of the pattern forming method as described above in the present invention other than using the resist composition according to the present invention as the resist composition.

In addition, the present invention provides the device characterized in having the substrate, which has a pattern formed by the pattern forming method as described above.

There is no special restriction of the device according to the present invention other than having the patterned substrate as described above. As the example of the device, a semiconductor chip such as IC, LSI, and the like or the semiconductor device such as a liquid crystal panel and a CCD are exemplified.

Next, an embodiment of the fabricating method for the semiconductor device (semiconductor element) using the resist composition as described above will bell described.

FIG. 1 is the flow chart of fabricate of the semiconductor device (the semiconductor chip such as IC, LSI, and the like or the liquid crystal panel and the CCD, and the like). In this example, a step S1 (circuit design) carries out circuit design of the semiconductor device. Step S2 (mask fabrication) fabricates the mask on which a circuit pattern designed is formed. On the other hand, step S3 (wafer fabrication) fabricates the wafer using such material as silicon. Step S4 (wafer process) is called a prestep and forms an actual circuit on the wafer by lithographic technology using the mask and the wafer prepared in the above described steps.

Reticle is carried and chucked to a reticle chuck. Then, the silicon wafer substrate, to which the resist composition according to the present invention is applied, is loaded on inside of the exposure apparatus. An alignment unit reads data for global alignment and on the basis of a result of measurement, a wafer stage is actuated to carry out exposure sequentially in predetermined positions.

The next step S5 (assemblage) is called a poststep and the step for making the semiconductor chip by using the wafer fabricated by the step S4 and includes steps such as an assembling step (dicing and bonding), a packaging step (chip packaging).

Step S6 (inspection) carries out inspection such as operation checking test, tolerance test, and the like of the semiconductor device fabricated in the step S5. Through these steps, the semiconductor device is completed and shipped (step S7).

Figure 2:
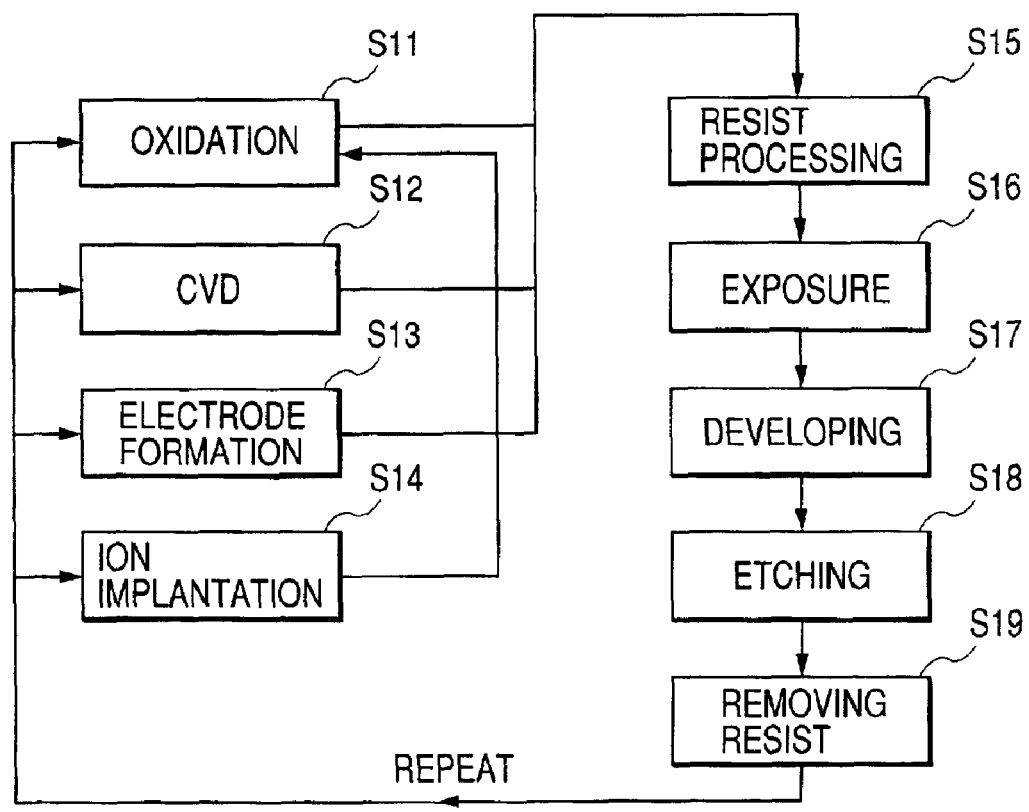
FIG. 2 is a flow chart illustrating the fabricating method for the semiconductor device according to the present invention.

FIG. 2 is the detailed flow chart of the wafer process of the step S4 as described above. First, step S11 (oxidation) oxidizes a surface of the wafer. Step S12 (CVD) forms an insulating film on the surface of the wafer.

Step S13 (electrode formation) forms an electrode on the wafer by evaporation. Step S14 (ion injection) injects an ion into the wafer. Step S15 (resist processing) applies a sensitizer (the resist composition according to the present invention) to the wafer.

Step S16 (exposure) carries out baking exposure of the circuit patter of the mask on the wafer by the exposing apparatus as described above.

Step S17 (developing) develops the wafer exposed. Step S18 carries out etching processing and the part except the resist developed by the step S19 is removed. Repeat of these steps forms multiple circuit pattern on the wafer.

EXAMPLE 1
(Photosensitive Resin Composition)

Pivalic acid of 20 g was dissolved in trifluoroacetic anhydride to activate at 50° C., and 20 g of hydroxypropyl cellulose (Aldrich Co. made) was then dissolved to add a pivaloyl group to hydroxypropyl cellulose. Following the reaction, a product was precipitated in a large volume of methyl alcohol to dry in vacuum resulting in yield of an objective polymer. The polymer was repeatedly dissolved, precipitated, and dried in vacuum for purification.

Triphenylsulfonium hexafluoroantimonate of 0.25 g as the photo acid generator was added to 5 g of the resulting polymer and stirred to yield the photosensitive resin composition.

EXAMPLE 2
(Preparation of Resist 1)

The photosensitive resin composition of 25 g yielded in Example 1 was dissolved in 97 g of propylene glycol monomethyl ether acetate and the resulting solution was filtered through a 0.1 μm mesh filter to yield 122 g of the resist composition according to the present invention.

EXAMPLE 3
(Preparation of Resist 2)2

Diphenyliodonium trifluoromethyl sulfonate salt of 0.15 g as the photo acid generator, 30 g of cresol novolac resin (manufactured by Mitsubishi Gas Chemical Company, Inc.), and 4.5 g of the polymer yielded in Example 1 were dissolved in propylene glycol monomethyl ether acetate of 100 ml (97 g), and the resulting solution was filtered through a 0.1 μm mesh filter to yield 131.7 g of the resist composition according to the present invention.

EXAMPLE 4
(Preparation of Resist 3)

Triphenylsulfonium hexafluoroantimonate of 0.08 g as the photo acid generator, 30 g of polyvinyl phenol (commercial name Maruka Linker; manufactured by Maruzen Petroleum Chemistry Co., Ltd.), and the polymer of 4.5 g yielded in Example 1 were dissolved in propylene glycol monomethyl ether acetate of 100 ml (97 g), and the resulting solution was filtered through the 0.1 μm mesh filter to yield 131.6 g of the resist composition according to the present invention.

EXAMPLE 5
(Preparation of Resist 4)

Triphenylsulfonium hexafluoroantimonate of 0.1 g as the photo acid generator, 30 g of polyglutaraldehyde polymer (polymer of glutaraldehyde, manufactured by Tokyo Kasei Corp.), which was employed as the polymer having alicyclic group, and the polymer of 4.5 g yielded in Example 1 were dissolved in propylene glycol monomethyl ether acetate of 100 ml (97 g), and the resulting solution was filtered through the 0.1 μm mesh filter to yield 131.6 g of the resist composition according to the present invention.

EXAMPLE 6
(Preparation of Resist 5)

Triphenylsulfonium hexafluoroantimonate of 0.08 g as the photo acid generator, 30 g of hydroxypropyl cellulose (Aldrich Corp. made), which was employed as the polymer having alicyclic group, and the polymer of 4.5 g yielded in Example 1 were dissolved in a solvent (93 g) prepared by mixing propylene glycol monomethyl ether acetate of 80 ml and 20 ml of ethanol anhydride, and the resulting solution was filtered through the 0.1 μm mesh filter to yield 127.6 g of the resist composition according to the present invention.

EXAMPLE 7
(Preparation of Resist 6)

Triphenylsulfonium hexafluoroantimonate of 0.08 g as the photo acid generator, 30 g of polyparahydroxyl sesquioxane, which was employed as the polymer having alkali-soluble silicon element, and the polymer of 4.5 g yielded in Example 1 were dissolved in a solvent (93 g) prepared by mixing propylene glycol monomethyl ether acetate of 80 ml and methylisobutyl ketone of 20 ml, and the resulting solution was filtered through the 0.1 μm mesh filter to yield 128 g of the resist composition according to the present invention.

EXAMPLE 8

The resist yielded in Example 2 was subjected to spin coat with the film thickness of 0.3 μm on a silicon wafer. Next, a pattern on the mask was transferred by using a reduction projection type exposure apparatus (stepper) having an ArF excimer laser as the light source and developed with 2.38% aqueous solution of tetramethyl ammonium hydroxide to yield the pattern of 0.18 µm.

EXAMPLE 9

The resist yielded in Example 3 was subjected to spin coat with the film thickness of 0.7 µm on a silicon wafer. Next, a drawing was carried out by using an electron drawing apparatus at an acceleration voltage of 50 kV and developed with 2.38% aqueous solution of tetramethyl ammonium hydroxide to yield the pattern of 0.15 µm.

EXAMPLE 10

The resist yielded in Example 4 was subjected to spin coat with the film thickness of 0.4 µm on a silicon wafer. Next, a tantalum pattern on a mask was transferred onto the resist through an X-ray mask by using an X-ray exposure apparatus and developed with 2.38% aqueous solution of tetramethyl ammonium hydroxide to yield the pattern of 0.15 µm.

EXAMPLE 11

The resist yielded in Example 5 was subjected to spin coat with the film thickness of 0.7 µm on a silicon wafer. Next, a pattern on a mask was transferred by using an exposure apparatus using a krypton fluorinate excimer laser as the light source and developed with 2.38% aqueous solution of tetramethyl ammonium hydroxide to yield the pattern of 0.2 µm.

EXAMPLE 12

The resist yielded in Example 6 was subjected to spin coat with the film thickness of 0.7 µm on a silicon wafer. Next, a pattern on a mask was transferred by using an exposure apparatus using the krypton fluorinate excimer laser as the light source and developed with 2.38% aqueous solution of tetramethyl ammonium hydroxide to yield the pattern of 0.2 µm.

EXAMPLE 13

A resist containing novolac resin and naphthoquinone azide as main components was subjected to spin coat with the film thickness of 1.0 µm on a silicon wafer and then subjected to hard baking. The resist yielded in Example 7 was subjected to spin coat on the resultant with the film thickness of 0.2 µm. Next, a pattern on a mask was transferred by using an exposure apparatus using F2 laser as the light source and developed with 2.38% aqueous solution of tetramethyl ammonium hydroxide to yield the pattern of 0.2 µm. In addition, the novolac type resist was processed by reactive ion etching using oxygen gas to transfer perfectly the 0.12 µm pattern formed on a top layer resist to a bottom layer resist.

EXAMPLE 14

The resist solution yielded in Example 2 was subjected to spin coat with the film thickness of 0.5 µm on a silicon wafer. Next, a drawing was carried out by using a proton beam and then, the development was carried out by using amyl acetate by $6 \times 10^{-8}$ C/cm$^2$ exposure. As a result, a 0.15 µm pattern was yielded.

EXAMPLE 15

A device having the signal input/output part and the patterned substrate, which was yielded in Examples as described above, was fabricated.

The present invention provides the photosensitive resin composition that is good in solubility against the solvent, thus the resist solution can be easily prepared, and solubility against the alkali developer of the base resin can be suppressed, is preferably used particularly in the vacuum ultraviolet range. In addition, the fabricating methods of a cheap resist composition suitable for mass production of easy fabrication, high sensitivity, and high resolution and the patterned substrate fabricable of the semiconductor device of high integration are provided. Moreover, devices such as the semiconductor device of high integration is provided.

What is claimed is:

1. A photosensitive resin composition comprising:
    a hydroxyalkyl cellulose derivative having a sugar repeating unit, said sugar repeating unit has a hydroxyalkyl group in a side chain; and
    a photo acid generator generating an acid by radiation of an electromagnetic wave or a charged particle beam,
    wherein at least one of the hydroxyl groups of the hydroxyalkyl group in the side chain has a substituent capable of generating a hydroxyl group when cleaved by the acid, and wherein the hydroxyalkyl cellulose derivative has a hydroxyethyl cellulose structure represented by formula (1):

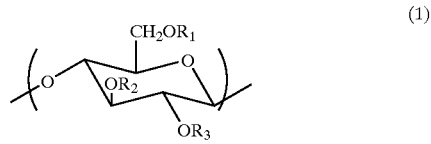

(1)

wherein each of $R_1$, $R_2$, and $R_3$ represents hydrogen or —CH$_2$CH$_2$OZ, which OZ represents a hydroxyl group or a substituent which is capable of generating a hydroxyl group when cleaved by the acid.

2. A photosensitive resin composition comprising:
    a hydroxyalkyl cellulose derivative having a sugar repeating unit, said sugar repeating unit has a hydroxyalkyl group in a side chain; and
    a photo acid generator generating an acid by radiation of an electromagnetic wave or a charged particle beam,
    wherein at least one of the hydroxyl groups of the hydroxyalkyl group in the side chain has a substituent capable of generating a hydroxyl group when cleaved by the acid, and wherein the hydroxyalkyl cellulose derivative has a hydroxypropyl cellulose structure represented by formula (2):

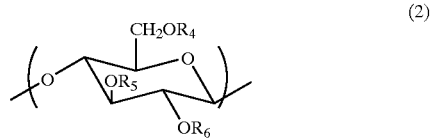

(2)

wherein each of $R_4$, $R_5$, and $R_6$ represents hydrogen or the following structure:

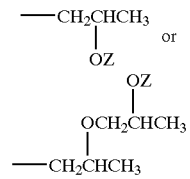

wherein OZ represents a hydroxyl group or a substituent which is capable of generating a hydroxyl group when cleaved by the acid.

3. A photosensitive resin composition comprising:

a hydroxyalkyl cellulose derivative having a sugar repeating unit, said sugar repeating unit has a hydroxyalkyl group in a side chain; and a photo acid generator generating an acid by radiation of an electromagnetic wave or a charged particle beam, wherein at least one of the hydroxyl groups of the hydroxyalkyl group in the side chain has a substituent capable of generating a hydroxyl group when cleaved by the acid, and wherein said hydroxyalkyl cellulose derivative has a t-butoxycarbonyl group.

4. A photosensitive resin composition comprising:

a hydroxyalkyl cellulose derivative having a sugar repeating unit, said sugar repeating unit has a hydroxyalkyl group in a side chain; and a photo acid generator generating an acid by radiation of an electromagnetic wave or a charged particle beam, wherein at least one of the hydroxyl groups of the hydroxyalkyl group in the side chain has a substituent capable of generating a hydroxyl group when cleaved by the acid, and wherein said hydroxyalkyl cellulose derivative has a pivaloyl group.

* * * * *